(12) United States Patent
Kitamura et al.

(10) Patent No.: US 7,923,839 B2
(45) Date of Patent: Apr. 12, 2011

(54) SEMICONDUCTOR DEVICE AND METHOD FOR FABRICATING SEMICONDUCTOR DEVICE

(75) Inventors: Masayuki Kitamura, Kanagawa (JP); Junichi Wada, Kanagawa (JP); Hideto Matsuyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 203 days.

(21) Appl. No.: 12/408,567

(22) Filed: Mar. 20, 2009

(65) Prior Publication Data

US 2009/0236746 A1 Sep. 24, 2009

(30) Foreign Application Priority Data

Mar. 21, 2008 (JP) .................................. 2008-074417

(51) Int. Cl.
*H01L 23/48* (2006.01)
(52) U.S. Cl. ................. 257/751; 257/767; 257/E23.011; 438/627
(58) Field of Classification Search ................. 257/751, 257/E23.011, E21.585, 750, 759, 761, 766, 257/E21.584; 438/653
See application file for complete search history.

(56) References Cited

U.S. PATENT DOCUMENTS

| | | | |
|---|---|---|---|
| 5,714,418 A * | 2/1998 | Bai et al. | 438/627 |
| 5,858,873 A * | 1/1999 | Vitkavage et al. | 438/626 |
| 6,093,966 A * | 7/2000 | Venkatraman et al. | 257/751 |
| 6,538,324 B1 * | 3/2003 | Tagami et al. | 257/751 |
| 7,453,149 B2 * | 11/2008 | Huang et al. | 257/751 |
| 7,531,902 B2 * | 5/2009 | Kim et al. | 257/751 |
| 2005/0156315 A1 * | 7/2005 | Lee et al. | 257/751 |

FOREIGN PATENT DOCUMENTS

JP 07-201779 8/1995

OTHER PUBLICATIONS

Kitamura et al.; "Highly Reliable Low Resistance Cu Contact Using Novel CVD RU/TIN/TI Stacked Liner", Proc. IEEE International Interconnect Technology Conference (IITC), pp. 55-57, (2008).

* cited by examiner

*Primary Examiner* — Roy K Potter
(74) *Attorney, Agent, or Firm* — Finnegan, Henderson, Farabow, Garrett & Dunner, L.L.P.

(57) ABSTRACT

A semiconductor device includes a contact plug electrically connected to a semiconductor substrate; a first barrier metal film with a columnar crystal structure arranged in contact with the semiconductor substrate at least on a bottom surface side of the contact plug; an amorphous film made of a material of the first barrier metal film arranged in contact with the first barrier metal film at least on the bottom surface side of the contact plug; a second barrier metal film made of a material identical to that of the first barrier metal film and having a columnar crystal structure, at least a portion of which is arranged in contact with the amorphous film on the bottom surface side and a side surface side of the contact plug; and a dielectric film arranged on the side surface side of the contact plug.

20 Claims, 13 Drawing Sheets

Ref.

or

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from prior Japanese Patent Application No. 2008-074417 filed on Mar. 21, 2008, in Japan, the entire contents of which are incorporated herein by reference.

BACKGROUND OF THE INVENTION

1. Field of the Invention

The present invention is related to a semiconductor device and a method for fabricating a semiconductor device and is related to, for example, a semiconductor device having a contact plug for connecting a device portion and a copper (Cu) wire arranged therein and a method for fabricating such a semiconductor device.

2. Related Art

In recent years, new micro-processing technologies have been developed with higher integration and higher large-scale integrated (LSI) circuit performance. In particular, the recent trend is to replace aluminum (Al) alloys with low-resistance copper (Cu) or Cu alloys (hereinafter, referred to collectively as "Cu") as wire materials to achieve higher LSI performance. Thus, with the aforementioned finer patterns of semiconductor integrated circuits in recent years, a contact hole to connect a Cu wire and a substrate diffusion layer and that to connect a Cu wire and a gate electrode of a transistor have a smaller diameter. Accordingly, the contact holes have an increasingly higher aspect ratio. While aluminum (Al) or tungsten (W) is conventionally used for a contact plug formed in a semiconductor device with a fine structure, application of Cu having lower resistance than W as a contact plug material is being considered to meet the demand for further reduced plug resistance.

One problem that arises here is the occurrence of a junction leak (J/L) by Cu being diffused to a semiconductor substrate. To prevent the junction leak, a barrier layer is formed between a contact plug material and a semiconductor substrate. Here, if Al is used as a contact plug material, a two-layer barrier metal film is formed by forming a TiN film whose crystal orientation is (100) on a semiconductor substrate and then forming TiN, whose crystal orientation (111) has high reliability with Al on the TiN film in the (100) orientation, and it is disclosed in patent documents (see Published Unexamined Japanese Patent Application No. H07-201779, for example).

On the other hand, tantalum (Ta) or tantalum nitride (TaN) is conventionally used as barrier layer material for a Cu wire used in an upper portion of a contact plug. Thus, if Cu is used as a contact plug material, a barrier metal film of Ta or TaN is one possible candidate. However, while these materials have barrier properties against Cu diffusion, a barrier metal film is formed by a sputter process and, as such, it has difficulty in forming a film at the bottom surface side of a contact hole with a high aspect ratio. If a barrier layer is made thicker to ensure barrier properties, the barrier film formed at a frontage of a contact hole may overhang to close the entrance of the contact hole. Given these conditions, poor embedding is expected when Cu is embedded in a plating process. A method of forming a barrier layer by, for example, a chemical vapor deposition (CVD) method with good step coverage is a known method of solving this problem. For example, materials of a barrier layer that can be formed by the CVD method include titanium nitride (TiN). The overhang problem is solved by applying titanium nitride (TiN) to the barrier layer. However, a problem related to insufficient barrier properties may result, causing J/L by Cu being diffused to a substrate.

BRIEF SUMMARY OF THE INVENTION

In accordance with one aspect of this invention, a semiconductor device includes a contact plug electrically connected to a semiconductor substrate; a first barrier metal film with a columnar crystal structure arranged in contact with the semiconductor substrate at least on a bottom surface side of the contact plug; an amorphous film made of a material of the first barrier metal film arranged in contact with the first barrier metal film at least on the bottom surface side of the contact plug; a second barrier metal film made of a material identical to that of the first barrier metal film and having a columnar crystal structure, at least a portion of which is arranged in contact with the amorphous film on the bottom surface side and a side surface side of the contact plug; and a dielectric film arranged on the side surface side of the contact plug.

In accordance with another aspect of the invention, a semiconductor device includes a contact plug electrically connected to a semiconductor substrate; a first barrier metal film with a columnar crystal structure arranged in contact with the semiconductor substrate at least on a bottom surface side of the contact plug; a second barrier metal film made of a material identical to that of the first barrier metal film and with a columnar crystal structure that is arranged on the bottom surface side and a side surface side of the contact plug and whose crystalline interface is shifted from that of the first barrier metal film; a metal containing film arranged in contact with the second barrier metal film and the contact plug on the bottom surface side and the side surface side of the contact plug; and a dielectric film arranged on the side surface side of the contact plug.

In accordance with a further aspect of the invention, a method for fabricating a semiconductor device, includes forming a dielectric film above a semiconductor substrate; forming an opening cutting through to the semiconductor substrate in the dielectric film; forming a first barrier metal film with a columnar crystal structure in the opening; forming an amorphous film made of a material of the first barrier metal film by reforming a surface of the first barrier metal film; forming a second barrier metal film made of a material identical to that of the first barrier metal film and with a columnar crystal structure above the amorphous film in the opening; and depositing a contact plug material inside the opening after the second barrier metal film being formed.

DETAILED DESCRIPTION OF THE INVENTION

Embodiment 1

In the embodiment 1, a semiconductor device that suppresses diffusion of a contact plug material to a substrate and a method for fabricating a semiconductor device will be described. The embodiment 1 will be described below with reference to drawings.

Figure 1:
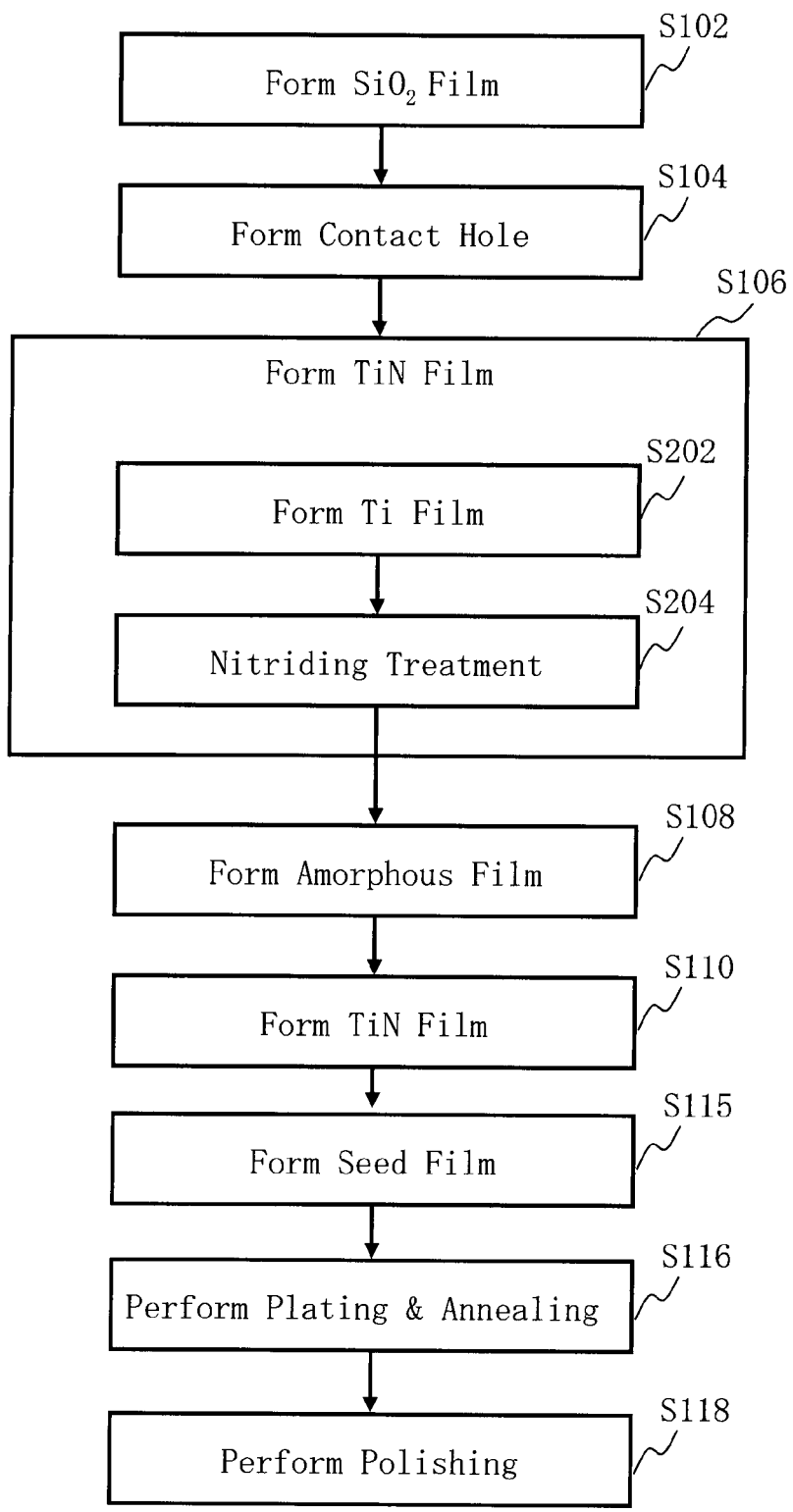
FIG. 1 is a flow chart showing principal parts of a method for fabricating a semiconductor device in an embodiment 1.

FIG. 1 is a flow chart showing the principal parts of a method for fabricating a semiconductor device in the embodiment 1. In FIG. 1, a series of processes, including an $SiO_2$ film formation process (S102), contact hole formation process (S104), TiN film formation process (S106), amorphous film formation process (S108), TiN film formation process (S110), seed film formation process (S115), plating & annealing process (S116), and polishing process (S118) are performed in the method for fabricating a semiconductor device of the embodiment 1. In the TiN film formation process (S106), a series of processes of a Ti film formation process (S202) and nitriding treatment process (S204) are performed as internal processes thereof.

FIG. 2A to FIG. 2D are sectional views showing processes performed corresponding to the flow chart in FIG. 1.

FIG. 2A to FIG. 2D show the $SiO_2$ film formation process (S102) to the nitriding treatment process (S204) in FIG. 1.

Figure 2A:
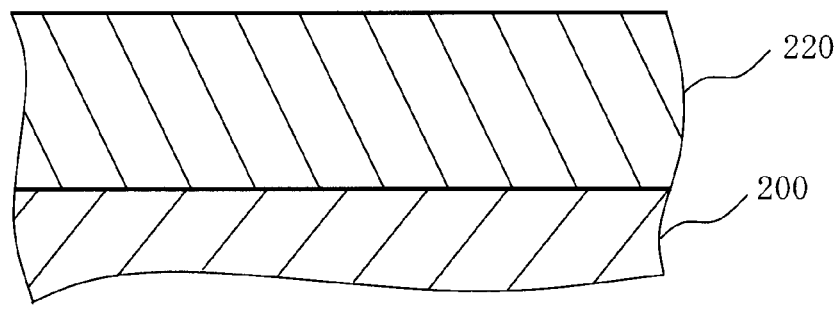
FIG. 2A to FIG. 2D are sectional views showing processes performed corresponding to the flow chart in FIG. 1.

In FIG. 2A, as the $SiO_2$ film formation process (S102) to be a dielectric film formation process, a thin film of $SiO_2$ of thickness of, for example, 500 nm is deposited on the surface of a semiconductor substrate 200 in which a device portion such as a substrate diffusion layer and a gate electrode is formed by the CVD (chemical vapor deposition) method to form an $SiO_2$ film 220 to be a dielectric film. The film is formed by the CVD method here, but other methods may also be used. A silicon wafer of, for example, 300 mm in diameter, is used as the semiconductor substrate 200. The device portion is not illustrated here.

Figure 2B:
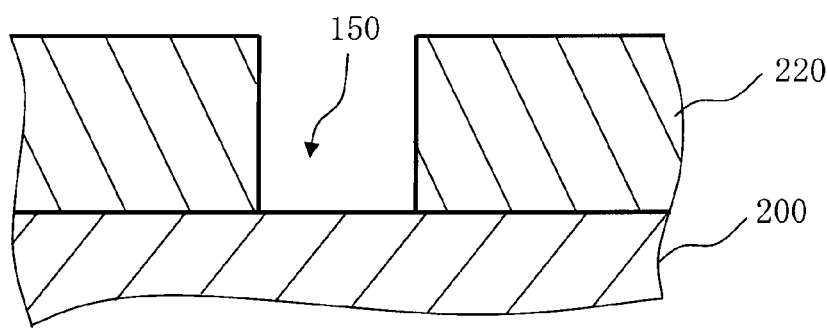

In FIG. 2B, an opening 150 cutting through to the semiconductor substrate 200, which is a contact hole structure to connect to the device portion in lithography and dry etching processes, is formed in the $SiO_2$ film 220 as the contact hole formation process (S104) that will be an opening formation process. For example, an opening 150 of 90 nm in diameter and 500 nm in depth is formed. The opening 150 can be formed substantially perpendicularly to the surface of the substrate 200 by removing the exposed $SiO_2$ film 220 by the anisotropic etching method, as opposed to the semiconductor substrate 200, where a resist film is formed on the $SiO_2$ film 220 by undergoing a resist application process and a lithography process such as an exposure process (which are not shown). As an example, the opening 150 may be formed by the reactive ion etching.

Next, a barrier metal film in a first layer (first barrier metal film) with a columnar crystal structure is formed on an inner wall (a sidewall and bottom surface) of the opening 150 formed in the opening formation process and the surface of the $SiO_2$ film 220 by using the plasma CVD method as the TiN film formation process (S106). Here, the barrier metal film in the first layer is formed by undergoing a process of two steps.

Figure 2C:
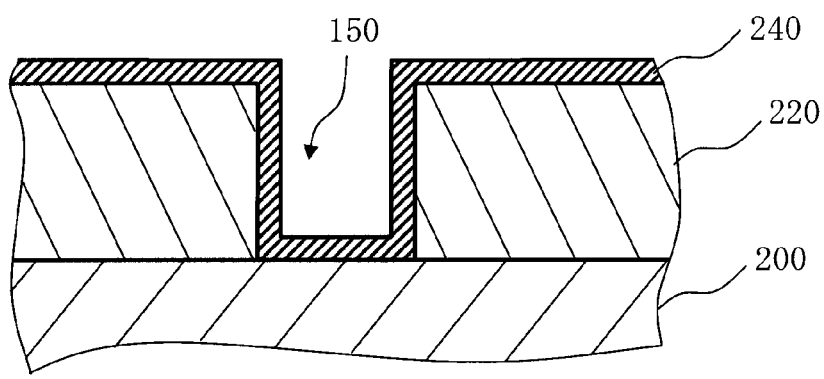

First, in FIG. 2C, as the Ti film formation process (S202), a Ti film 240 having a columnar crystal structure in (200) orientation using a refractory metal Ti is formed on the inner wall (the sidewall and bottom surface) of the opening 150 and the surface of the $SiO_2$ film 220 to a thickness of 2 to 10 nm by using the CVD method. The Ti film 240 is formed by using the plasma CVD method. Plasma is generated by opposite pole electrodes after pouring a mixed gas of titanium tetrachloride ($TiCl_4$), hydrogen ($H_2$), and argon (Ar) and setting a predetermined pressure inside the chamber and substrate temperature. In this manner, the Ti film 240 can be formed by reduction treatment on $TiCl_4$ with $H_2$. The pressure inside the chamber is suitably set to, for example, 400 to 1000 Pa. RF power is suitably set to 400 to 1000 W. The substrate temperature is suitably set to 400 to 700° C. The gas quantity of $TiCl_4$ is suitably set to $1.67 \times 10^{-3}$ $Pa \cdot m^3/s$ (1 sccm) to $3.34 \times 10^{-2}$ $Pa \cdot m^3/s$ (20 sccm), that of $H_2$ set to $1.67 \times 10^{-1}$ $Pa \cdot m^3/s$ (100 sccm) to 2.51 $Pa \cdot m^3/s$ (1500 sccm), and that of Ar set to 1.67 $Pa \cdot m^3/s$ (1000 sccm) to 6.68 $Pa \cdot m^3/s$ (4000 sccm). The Ti film 240 formed at the bottom of the opening 150 reduces and removes the oxide film of the substrate 200 formed at the bottom of the opening 150 by Ti to form a titanium silicide ($TiSi_2$) film. Accordingly, ohmic contact can be ensured.

Figure 2D:
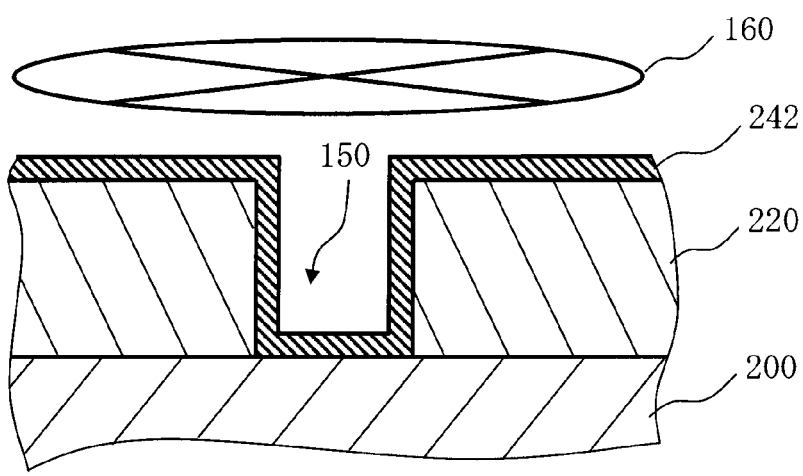

Next, in FIG. 2D, as the nitriding treatment process (S204), the Ti film 240 is converted by nitriding treatment into a TiN film 242, which is a nitride of the Ti film 240. When the Ti film 240 is formed by using $TiCl_4$, the Ti film 240 containing a large amount of chlorine (Cl) is formed on the inner wall (the sidewall and bottom surface) of the opening 150 and the surface of the $SiO_2$ film 220. Thus, a large amount of Cl is also contained in the $TiSi_2$ film. If left as is, resistance increases with contact, worsening the adhesive properties. Thus, the Ti film 240 is converted into the TiN film 242 and Cl can be removed from inside the Ti film 240 and the $TiSi_2$ film by pouring a mixed gas of ammonia ($NH_3$), $H_2$, and Ar over the Ti film 240 to generate plasma 160. The pressure inside the chamber is suitably set to, for example, 400 to 1000 Pa. RF power is suitably set to 400 to 1000 W. The substrate temperature is suitably set to 400 to 700° C. The gas quantity of $NH_3$ is suitably set to $8.35 \times 10^{-1}$ $Pa \cdot m^3/s$ (500 sccm) to 2.51 $Pa \cdot m^3/s$ (1500 sccm), that of $H_2$ set to $1.67 \times 10^{-1}$ $Pa \cdot m^3/s$ (100 sccm) to 2.51 $Pa \cdot m^3/s$ (1500 sccm), and that of Ar set to 1.67 $Pa \cdot m^3/s$ (1000 sccm) to 6.68 $Pa \cdot m^3/s$ (4000 sccm).

As described above, the TiN film 242 (first barrier metal film) with a columnar crystal structure in the (200) orientation can be formed on the surface of the $SiO_2$ film 220. Moreover, since the CVD method is used here, a barrier metal film of the TiN film 242 can be formed at least at the bottom surface even if the contact hole has a large aspect ratio.

Figure 3A:
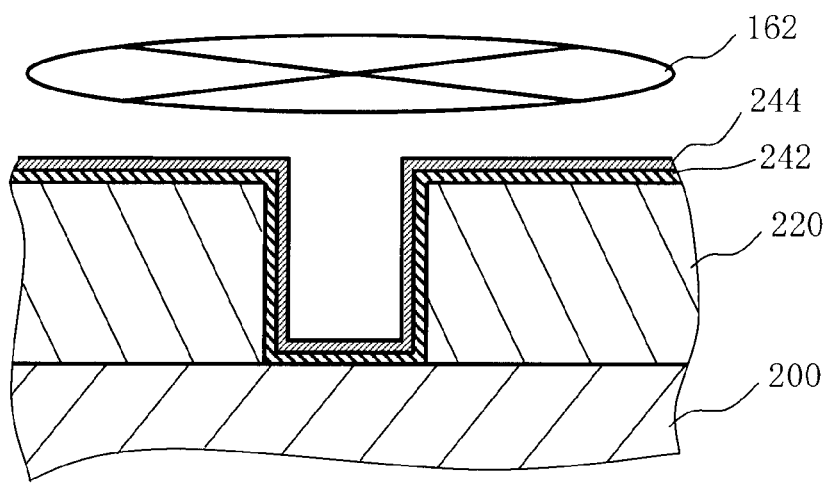
FIG. 3A to FIG. 3C are sectional views showing processes performed corresponding to the flow chart in FIG. 1.
Figure 3B:
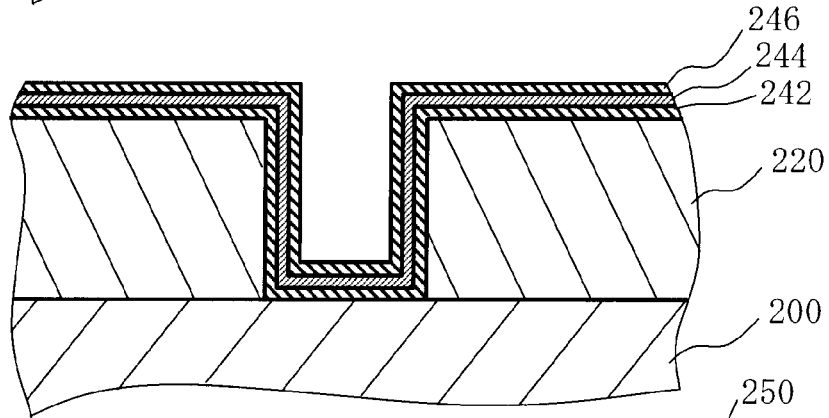
Figure 3C:
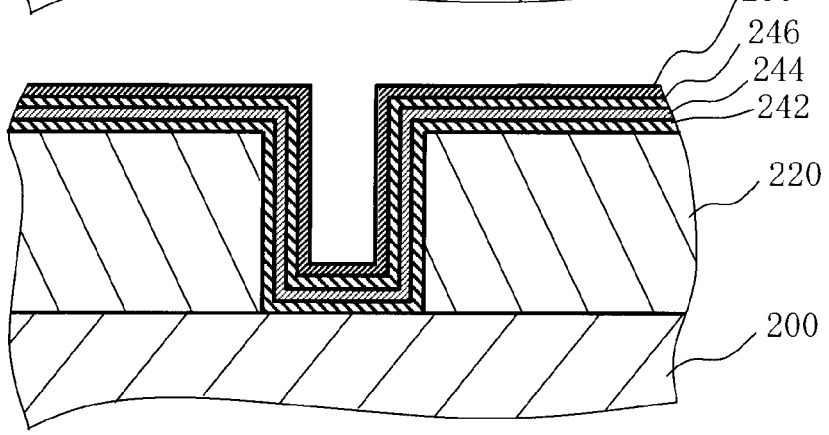

FIG. 3A to FIG. 3C are sectional views showing processes performed corresponding to the flow chart in FIG. 1.

FIG. 3A to FIG. 3C show the amorphous film formation process (S108) to the seed film formation process (S115) in FIG. 1.

In FIG. 3A, the surface layer of the TiN film 242 is reformed to form an amorphous film 244 (amorphous layer) of TiN on the surface layer of the TiN film 242 as the amorphous film formation process (S108). Here, the surface layer of the TiN film 242 can be converted into the amorphous film 244 by pouring a mixed gas of $NH_3$, $H_2$, and Ar over the TiN film 242 to generate plasma 162. The pressure inside the chamber is suitably set to, for example, 400 to 1000 Pa. RF power is suitably set to 400 to 1000 W. The substrate temperature is suitably set to 400 to 700° C. The gas quantity of $NH_3$ is suitably set to $8.35\times10^{-1}$ Pa·m³/s (500 sccm) to 2.51 Pa·m³/s (1500 sccm), that of $H_2$ set to $1.67\times10^{-1}$ Pa·m³/s (100 sccm) to 2.51 Pa·m³/s (1500 sccm), and that of Ar set to 1.67 Pa·m³/s (1000 sccm) to 6.68 Pa·m³/s (4000 sccm). Since these process conditions are the same as those for the nitriding treatment process (S204) the amorphous film 244 can suitably be formed by continuing the state subsequent to the nitriding treatment process (S204).

Here, the TiN film 242 is converted into the amorphous film 244 by being exposed to the plasma 162 by a mixed gas of $NH_3$, $H_2$, and Ar, but the method of inversion is not limited to this. For example, the TiN film 242 may suitably be converted into the amorphous film 244 by being exposed to $H_2$ plasma. Alternatively, the TiN film 242 may suitably be converted into the amorphous film 244 by Ar sputtering.

In FIG. 3B, a TiN film 246 to be a barrier metal film in a second layer (second barrier metal film) having a columnar crystal structure in the (200) orientation, which is the same as that of the TiN film 242, is formed on the inner wall (the sidewall and bottom surface) of the opening 150 with an amorphous film 244 formed at least at the bottom surface of the opening 150 and on the surface of the amorphous film 244 to a thickness of 2 to 10 nm as the TiN film formation process (S110) by using the thermal CVD method. By using the thermal CVD method, deposition of the TiN film 246 onto the sidewall of the opening 150 can be better facilitated than the case in which the plasma CVD method is used. A mixed gas of $TiCl_4$, $NH_3$, and nitrogen ($N_2$) is poured and the predetermined pressure inside the chamber and substrate temperature are set. The TiN film 246 can be formed in this manner. The pressure inside the chamber is suitably set, for example, to 200 to 1000 Pa. The substrate temperature is suitably set to 400 to 700° C. The gas quantity of $TiCl_4$ is suitably set to $1.67\times10^{-2}$ Pa·m³/s (10 sccm) to $1.67\times10^{-1}$ Pa·m³/s (100 sccm), that of $NH_3$ set to $8.35\times10^{-1}$ Pa·m³/s (500 sccm) to 2.51 Pa·m³/s (1500 sccm), and that of $N_2$ set to $8.35\times10^{-1}$ Pa·m³/s (500 sccm) to 5.01 Pa·m³/s (3000 sccm). In addition to the thermal CVD method, the atomic layer deposition (ALD) method (or the atomic layer chemical vapor deposition (ALCVD) method) is suitably used as a deposition method of the TiN film 246.

Simply forming the TiN film 246 on the TiN film 242 allows the TiN film 246 to epitaxially grow with respect to the TiN film 242 so that a crystal almost identical to that of the TiN film 242 will be formed. Thus, a crystal inheriting the crystalline interface of the TiN film 242 as is will be formed. In contrast, in the embodiment 1, while the TiN film 246 has a columnar crystal structure in the (200) orientation that is the same as that of the TiN film 242, the amorphous film 244 is formed between the TiN film 242 and the TiN film 246 so that the crystalline interface of the TiN film 242 can be blocked once. Thus, a crystal of the TiN film 246 can be formed in such a way that the crystalline interface of the TiN film 246 is shifted from that of the TiN film 242.

In FIG. 3C, a thin Cu film to be a cathode electrode in a next electrolytic plating process is deposited (formed) as a seed film 250 on the inner wall of the opening 150 on which the TiN film 242, the amorphous film 244, and the TiN film 246 are laminated and the surface of the TiN film 246 to a thickness of 10 to 50 nm by the physical vapor deposition (PVD) method such as a sputter process as the seed film formation process (S115).

Figure 4A:
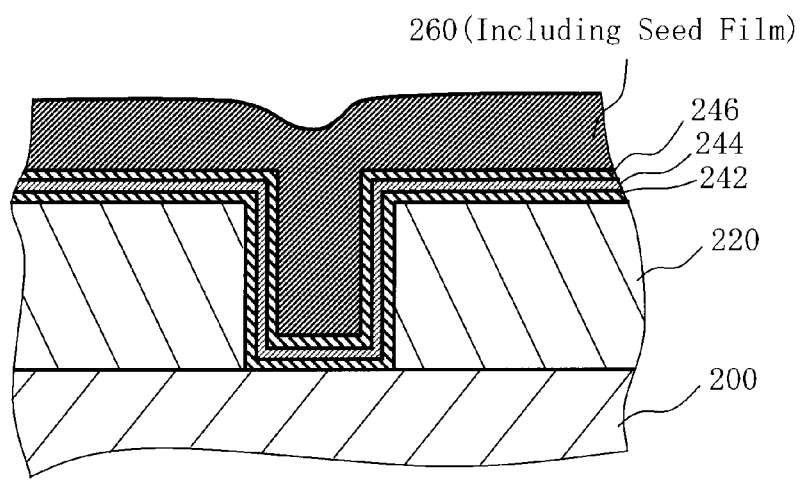
FIG. 4A and FIG. 4B are sectional views showing processes performed corresponding to the flow chart in FIG. 1.
Figure 4B:
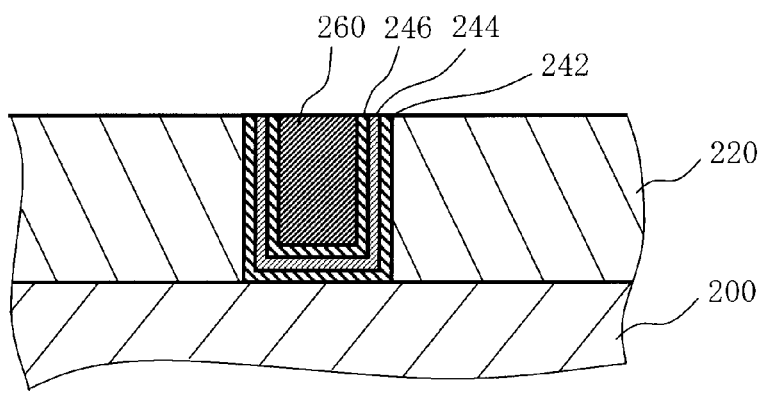

FIG. 4A and FIG. 4B are sectional views showing processes performed corresponding to the flow chart in FIG. 1.

FIG. 4A and FIG. 4B show the plating & annealing process (S116) and the polishing process (S118) in FIG. 1.

In FIG. 4A, as the plating & annealing process (S116), a Cu film 260, which is an example of conductive material, is deposited on the surface of the opening 150 and the substrate 200 on which the seed film 250 is formed by an electrochemical growth method, such as electrolytic plating using the seed film 250 as a cathode electrode. Here, for example, the Cu film 260 of the thickness 500 nm is deposited and annealing is performed at, for example, 250° C. for 30 min.

In FIG. 4B, the surface of the substrate 200 is polished by the CMP method to remove the Cu film 260 including the seed film 250 to be a wire layer, the TiN film 242, the amorphous film 244, and the TiN film 246 deposited on the surface excluding the opening by polishing as the polishing process (S118). As a result, as shown in FIG. 4B, the surface can be planarized. Thus, a Cu contact plug can be formed by the above processes.

The Cu film 260 to be the contact plug electrically connected to the semiconductor substrate is formed as described above. A semiconductor device formed in this manner has the TiN film 242 arranged in contact with the substrate 200, having a columnar crystal structure and formed at least on a bottom surface side of the Cu film 260. The amorphous film 244 of TiN arranged in contact with the TiN film 242 is formed at least on the bottom surface side of the Cu film 260. Moreover, the TiN film 246, at least a portion of which is arranged in contact with the amorphous film 244 and the Cu film 260, which is made of a material identical to that of the TiN film 242 and has columnar crystal structure is formed on the bottom surface side and a side surface side of the Cu film 260. The $SiO_2$ film 220 is arranged on the side surface side of the Cu film 260.

Figure 5:
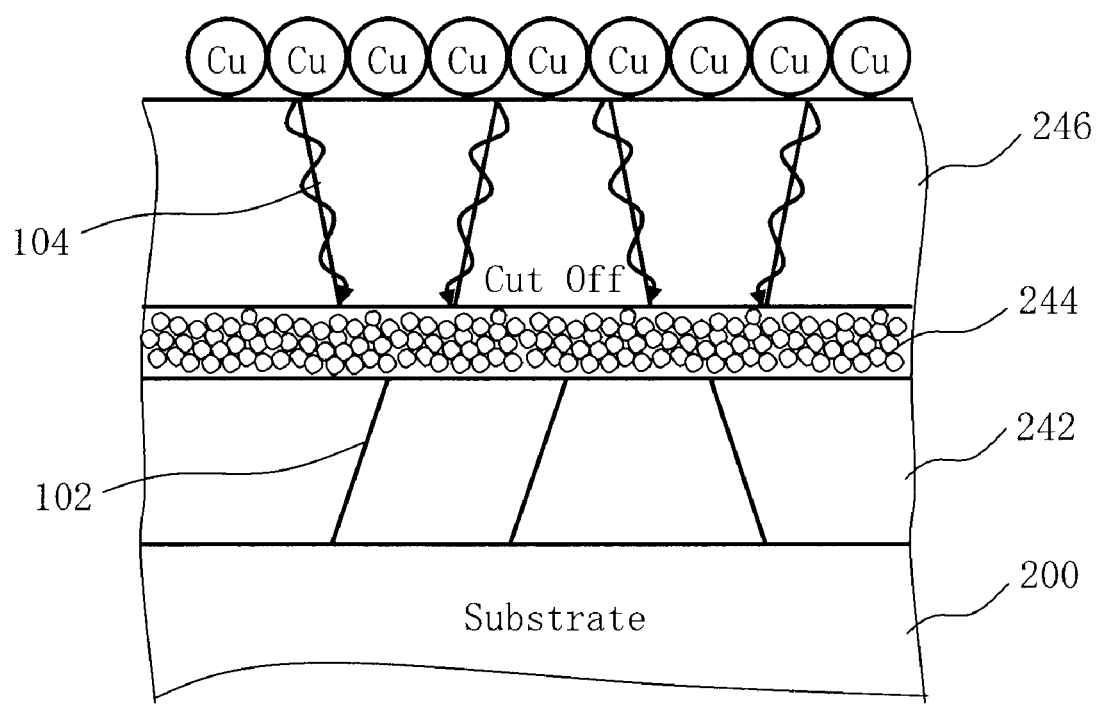
FIG. 5 is a conceptual diagram exemplifying Cu diffusion paths in the embodiment 1.

FIG. 5 is a conceptual diagram exemplifying Cu diffusion paths in the embodiment 1.

In FIG. 5, a crystalline interface 102 is generated in the TiN film 242 in a columnar crystal structure. Similarly, a crystalline interface 104 is generated also in the TiN film 246 in a columnar crystal structure. Cu of the contact plug material will be diffused using these crystalline interfaces as diffusion paths. However, since the amorphous film 244 is formed between the TiN film 242 and the TiN film 246 in the embodiment 1, the position of the crystalline interface 102 in the TiN film 242 and that of the crystalline interface 104 in the TiN film 246 can be shifted. Thus, the diffusion path of Cu being diffused through the crystalline interface 104 can be cut off by an interface of the TiN film 242 or the amorphous film 244. Therefore, barrier properties can be enhanced. As a result, J/L caused by diffusion of Cu to the semiconductor substrate can be avoided. In addition, diffusion of Cu to an inter-level dielectric film of a contact layer can also be prevented for the same reason.

The embodiment 1 is realized not only by shifting the crystalline interface of the TiN film 246 and that of the TiN film 242, but also by forming the amorphous film 244 therebetween and thus, the barrier properties are more enhanced than when the same material is simply laminated by changing the orientation.

Embodiment 2

In the embodiment 1, the configuration in which the barrier properties against Cu are enhanced by shifting the crystalline interface in the TiN film 242 and the crystalline interface in the TiN film 246 and the fabricating method thereof have been described. In the embodiment 2, the configuration that further enhances barrier properties than the embodiment 1 and the fabricating method thereof will be described. Further, in the embodiment 2, the fabricating method that removes impurities in a barrier metal film at low temperatures will also be described. The embodiment 2 will be described below with reference to the drawings.

Figure 6:
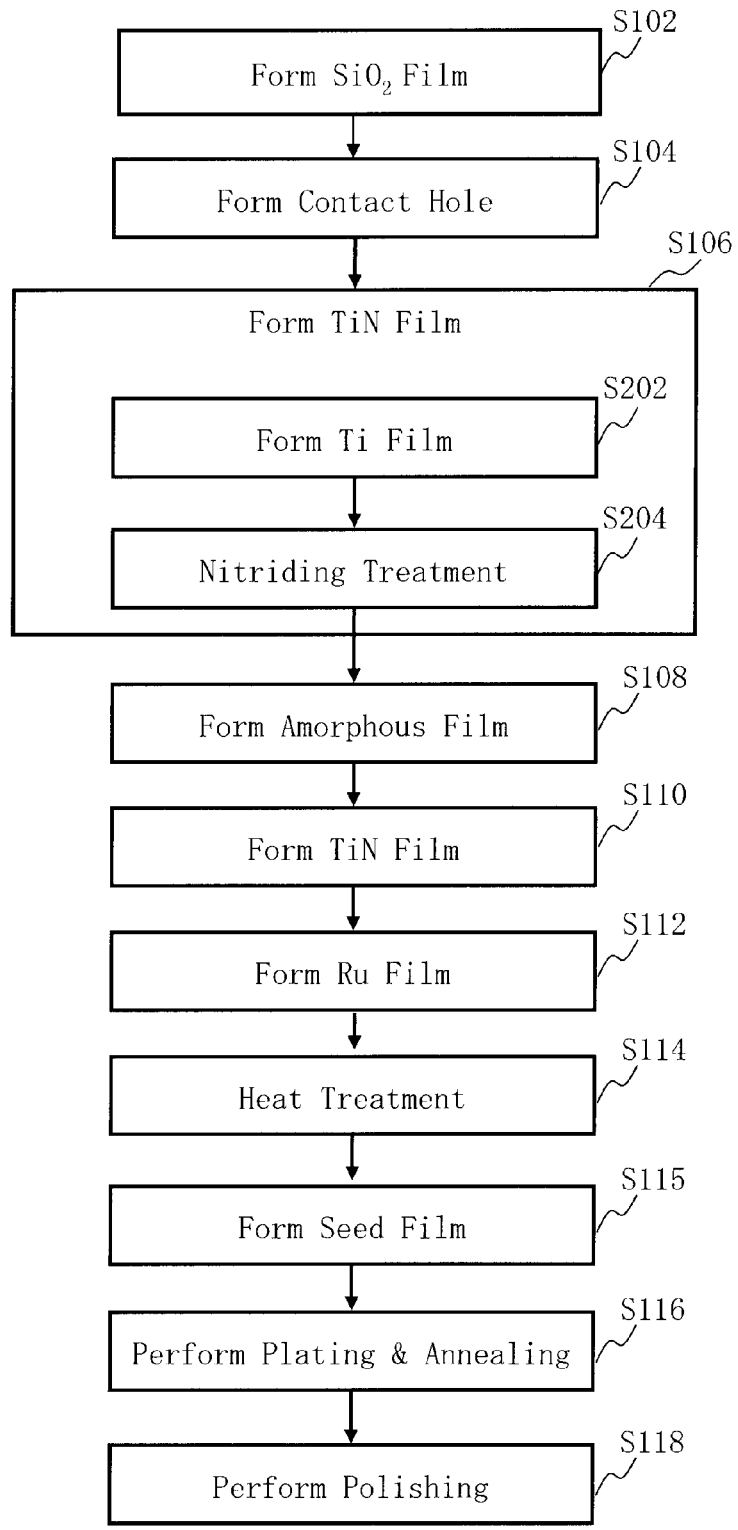
FIG. 6 is a flow chart showing principal parts of the method for fabricating a semiconductor device in an embodiment 2.

FIG. 6 is a flow chart showing the principal parts of the method for fabricating a semiconductor device in the embodiment 2. FIG. 6 is the same as FIG. 1 except that a ruthenium (Ru) film formation process (S112) and heat treatment process (S114) are added between the TiN film formation process (S110) and the seed film formation process (S115). Thus, the content of each process from the $SiO_2$ film formation process (S102) to the TiN film formation process (S110) is the same as that in the embodiment 1.

Figure 7A:
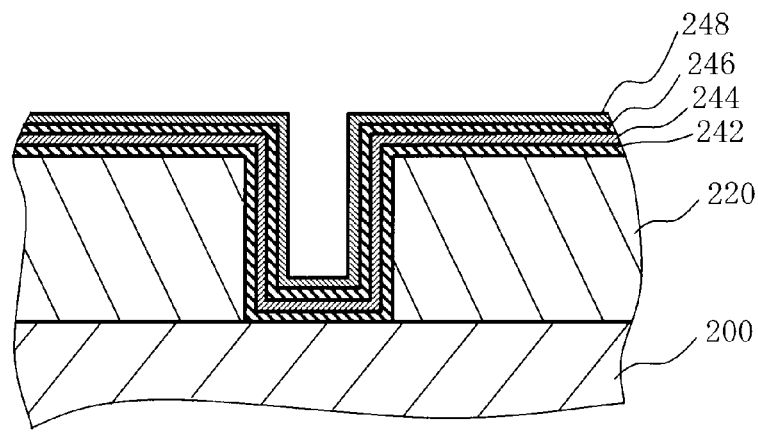
FIG. 7A to FIG. 7C are sectional views showing processes performed corresponding to the flow chart in FIG. 6.
Figure 7B:
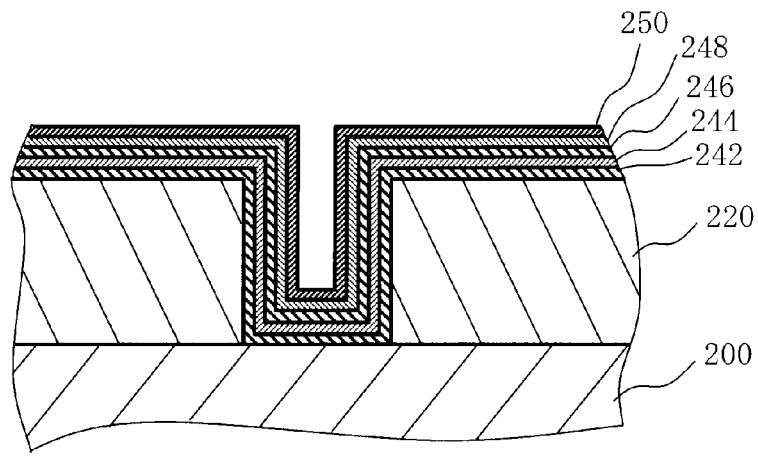
Figure 7C:
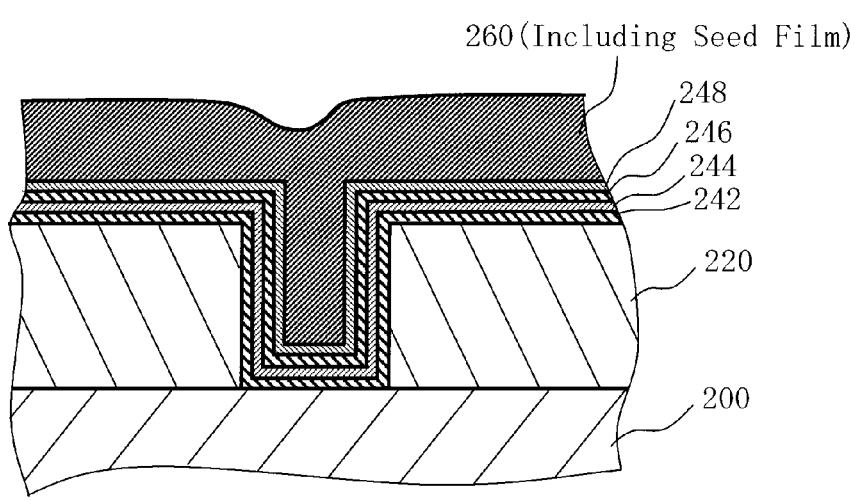

FIG. 7A to FIG. 7C are sectional views showing processes performed corresponding to the flow chart in FIG. 6.

FIG. 7A to FIG. 7C show the ruthenium (Ru) film formation process (S112) to the plating & annealing process (S116) in FIG. 6.

In FIG. 7A, as the ruthenium (Ru) film formation process (S112), a Ru film 248 (metal containing film) is formed on the inner wall (the sidewall and bottom surface) of the opening 150 in which the TiN film 246 is formed and the surface of the TiN film 246 for the substrate 200 on which the TiN film 246 is formed in FIG. 3B to a thickness of 1 to 5 nm by the CVD method. A gas containing Ru as a principal component is poured and the predetermined pressure inside the chamber and substrate temperature are set. In this manner, the Ru film 248 can be formed. The pressure inside the chamber is suitably set to, for example, 10 to 100 Pa. The substrate temperature is suitably set to 100 to 400° C. Dodecacarbonyl triruthenium ($Ru_3(CO)_{12}$) is suitably used as a gas containing Ru as a principal component. A sufficient gas quantity of $Ru_3(CO)_{12}$ is $1.67 \times 10^{-3}$ Pa·m$^3$/s (1 sccm) or less. The Ru film 248 can be deposited by subliming the gas. By forming the Ru film 248, the Ru film 248 can be segregated in at least the crystalline interfaces of the TiN film 246. Also, by forming the Ru film 248, wettability is increased so that embeddability in the subsequent plating & annealing process (S116) can be improved. In addition to the CVD method, the Ru film 248 is suitably formed by using the atomic layer deposition (ALD) method (or the atomic layer chemical vapor deposition (AL-CVD) method).

Here, when a barrier metal film is formed by the CVD method with good step coverage, degradation in device performance caused by impurities contained in the barrier metal film could become a problem. A barrier metal film formed by the CVD method may contain impurities derived from a material gas or reducing gas. If the quantity of such impurities is large, the impurities are diffused into the semiconductor substrate or wire to induce various kinds of failure. For example, fluorine is diffused into the substrate and reacts with the silicon (Si) substrate to form a high-resistance portion. Chlorine reacts with Cu to form copper chloride ($CuCl_2$) near the interface between the barrier metal film and contact plug, causing degradation in adhesion properties between the barrier metal film and Cu, leading to deterioration in reliability. Such deterioration of the interface could further cause poor conduction of a plating current when the Cu that is a contact plug material is embedded by a plating method, leading to further degradation in embeddability of Cu. Thus, removal of impurities by heat treatment after the barrier metal film is formed can be considered to prevent such problems, but heat treatment at high temperatures of 400° C. or more could cause deterioration of other devices. Therefore, it is preferable that impurities be sufficiently removed by heat treatment at low temperature.

Figure 8:
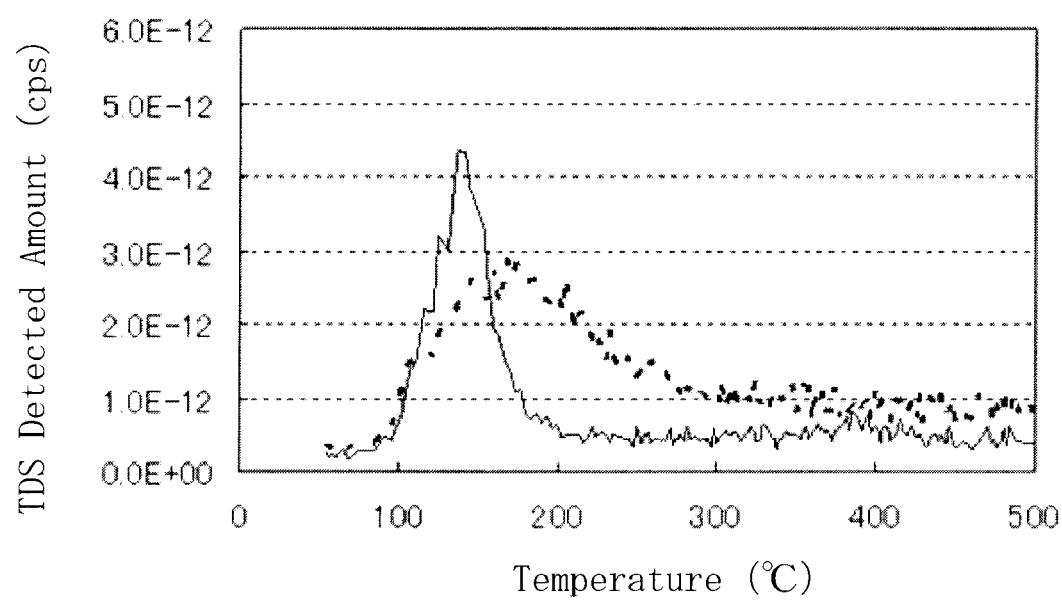
FIG. 8 is a graph exemplifying the relationship between heat treatment temperature and the amount of desorbed chlorine in the embodiment 2.

FIG. 8 is a graph exemplifying a relationship between the heat treatment temperature and the amount of desorbed chlorine in the embodiment 2. Here, an example of the results of investigating the amount of chlorine desorbed from the film and the heat treatment temperature by the thermal desorption spectroscopy method (TDS method) is shown when heat treatment is performed on each sample of TiN formed by the plasma CVD method on the semiconductor substrate using $TiCl_4$ as a material gas and $NH_3$ as a reducing gas and Ru formed on the formed TiN film to a thickness of 4 nm. In FIG. 8, the horizontal axis is the treatment temperature, the vertical axis the amount of desorbed chlorine, the dotted line the result of heat treatment on a single film of the TiN film, and the solid line a result of heat treatment on a laminated film of the TiN film and Ru film. As shown in FIG. 8, chlorine is desorbed when heat treatment is performed even at 500° C. for a single film of the TiN film so that chlorine remaining in the film can be estimated. On the other hand, a large amount of chlorine is desorbed at about 140° C. for a laminated film of the TiN film and Ru film, showing that almost all chlorine is removed by heat treatment at about 200° C. Thus, in the embodiment 2, such impurities are removed by performing heat treatment.

In other words, as a heat treatment process (S114), heat treatment is performed on the substrate 200 with the Ru film 248 formed thereon at, for example, 140 to 200° C. Accordingly, impurities contained in the TiN film 246 and the TiN film 242 are removed. Here, by performing heat treatment after the Ru film 248 has been formed on the TiN film 246 in the embodiment 2, impurities such as chlorine, fluorine, carbon, boron, and silicon can be removed at lower temperatures than the heat treatment temperature necessary when no Ru film is present. The pressure inside the chamber is suitably set, for example, to 1000 Pa or less for heat treatment. A mixed gas of $H_2$ and $N_2$ is supplied as an atmosphere gas. The gas quantity of $H_2$ is suitably set to $5.0 \times 10^{-2}$ Pa·m$^3$/s to $2.5 \times 10^{-1}$ Pa·m$^3$/s (30 to 150 sccm) and that of $N_2$ set to 1.67 Pa·m$^3$/s to 6.68 Pa·m$^3$/s (1000 to 4000 sccm). In particular, impurity removal efficiency can be improved by performing heat treatment under an $H_2$ atmosphere.

Here, the heat treatment process (S113) may be omitted if the quantity of impurities in the barrier metal film is such that deterioration of reliability is not caused. However, if impurities in the barrier metal film cause deterioration of reliability, impurities can be removed by heat treatment at low temperatures of 200° C. or less after a Ru film being formed on the barrier metal film containing impurities as described above. As a result, deterioration of devices caused by heat treatment at high temperatures can be suppressed or eliminated.

Then, in FIG. 7B, a thin Cu film to be a cathode electrode in the next electrolytic plating process shown in FIG. 7C is deposited (formed) on the inner wall of the opening 150 on which the TiN film 242, the amorphous film 244, the TiN film 246, and the Ru film 248 are laminated and the surface of the Ru film 248 as the seed film 250 to a thickness of 10 to 50 nm by the physical vapor deposition (PVD) method such as a sputter process as the seed film formation process (S115).

Figure 9:
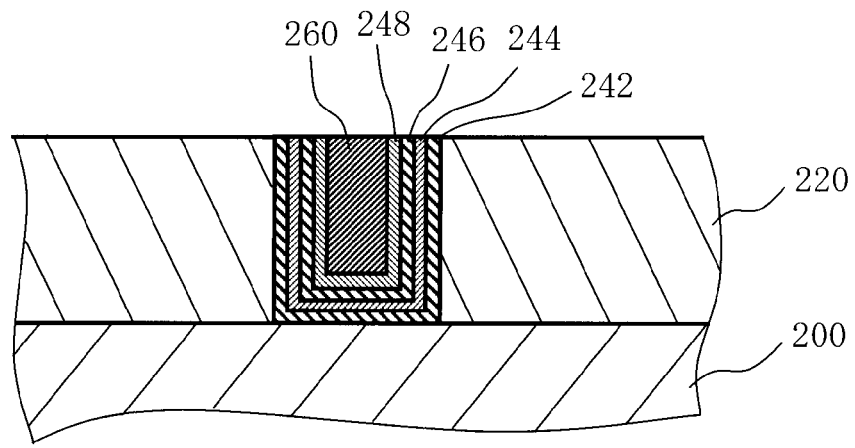
FIG. 9 is a sectional view showing the process performed corresponding to the flow chart in FIG. 6.

FIG. 9 is a sectional view showing a process performed corresponding to the flow chart in FIG. 6.

In FIG. 9, the polishing process (S118) in FIG. 6 is shown.

Content of each process between the seed film formation process (S115) to the polishing process (S118) is the same as that in the embodiment 1. As a result, as shown in FIG. 9, the surface can be planarized. Thus, a Cu contact plug can be formed by the above processes.

The Cu film 260 to be a contact plug electrically connected to the semiconductor substrate is formed as described above. A semiconductor device formed in this manner has the TiN film 242 arranged in contact with the substrate 200, having a columnar crystal structure and formed on at least the bottom surface side of the Cu film 260. The amorphous film 244 of TiN arranged in contact with the TiN film 242 then is formed on at least the bottom surface side of the Cu film 260. Moreover, the TiN film 246, at least a portion of which is arranged in contact with the amorphous film 244, which is made of a material identical to that of the TiN film 242 and has a columnar crystal structure, is formed on the bottom surface side and a side surface side of the Cu film 260. Then, as described above, the TiN film 246 is arranged on the TiN film 242 with crystalline interfaces of the TiN film 246 and the TiN film 242 shifted from each other. Then, the Ru film 248 arranged in contact with the TiN film 246 and the Cu film 260 is formed on the bottom surface side and the side surface side of the Cu film 260. The $SiO_2$ film 220 is arranged on the side surface side of the Cu film 260.

Figure 10:
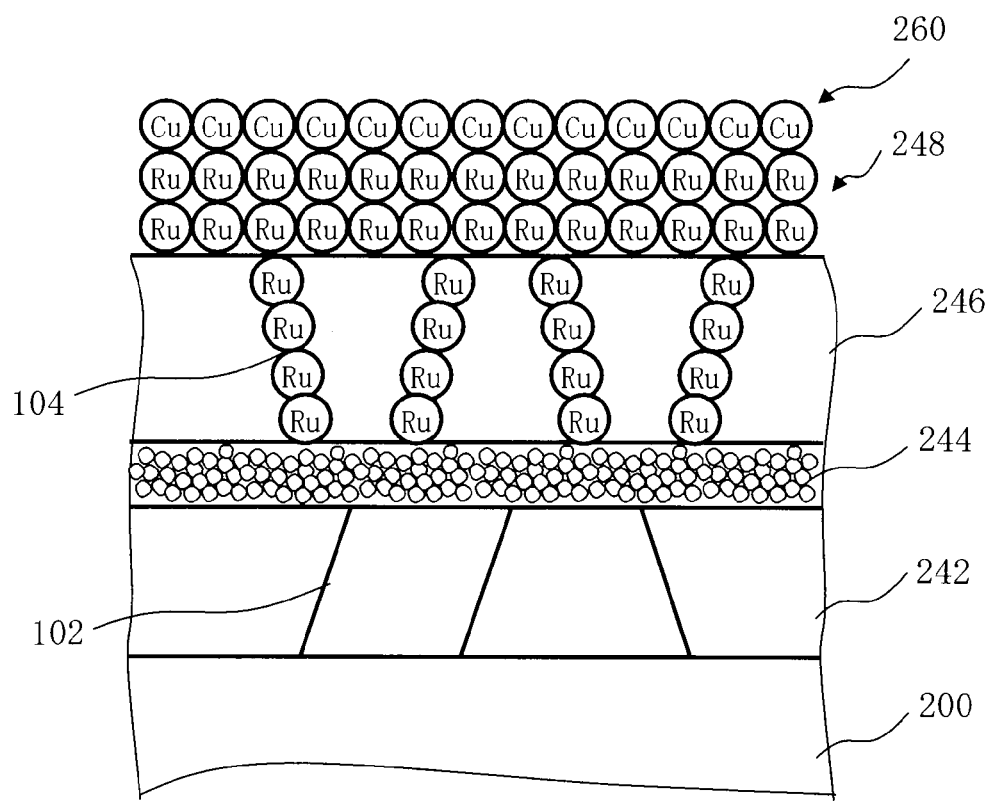
FIG. 10 is a conceptual diagram exemplifying Cu diffusion paths in the embodiment 2.

FIG. 10 is a conceptual diagram exemplifying Cu diffusion paths in the embodiment 2. In FIG. 10, as described above, since the amorphous film 244 is formed between the TiN film 242 and the TiN film 246, the position of the crystalline interface 102 in the TiN film 242 and that of the crystalline interface 104 in the TiN film 246 can be shifted. Thus, the Cu diffusion path being diffused through the crystalline interface 104 can be cut off by an interface of the TiN film 242 or the amorphous film 244. Further, in the embodiment 2, the Cu diffusion path can be cut off by the Ru film 248 being segregated at least into the crystalline interface 104 of the TiN film 246 in the second layer. Thus, barrier properties are obtained that are more enhanced than those in the embodiment 1. As a result, the reliability of J/L avoidance caused by diffusion of Cu to the semiconductor substrate can be further increased. In addition, diffusion of Cu to an inter-level dielectric film of a contact layer can also be prevented for the same reason. Moreover, experimental results show that the structure of the embodiment 2 is superior to any of the following in barrier properties: a sputter film of Ti, a sputter laminated film of Ti/TiN, and/or a CVD film of ruthenium (Ru) that can become a barrier metal layer of Cu in barrier properties.

Embodiment 3

In the embodiment 2, impurities in a barrier metal film are removed by heat treatment. In the embodiment 3, a method of efficiently removing chlorine in particular (from among those impurities remaining in a barrier metal film) near the interface between the barrier metal film and a Cu film before formation of the seed film 250 will be described.

Figure 11:
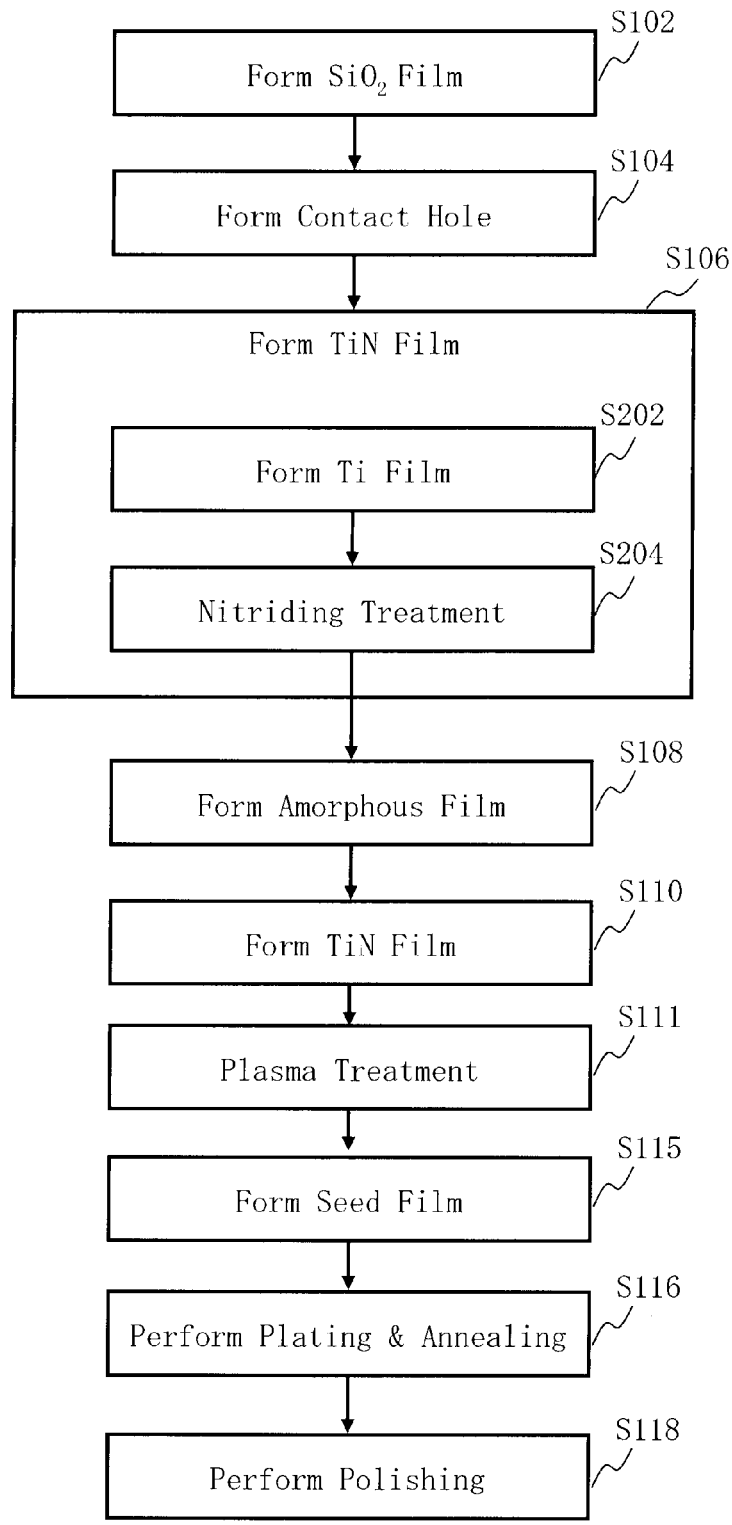
FIG. 11 is a flow chart showing principal parts of the method for fabricating a semiconductor device in an embodiment 3.

FIG. 11 is a flow chart showing principal parts of the method for fabricating a semiconductor device in the embodiment 3. FIG. 11 is the same as the FIG. 1 except that a plasma treatment process (S111) is added between the TiN film formation process (S110) and the seed film formation process (S115). Thus, the content of each process from the $SiO_2$ film formation process (S102) to the TiN film formation process (S110) is the same as that in the embodiment 1.

Figure 12A:
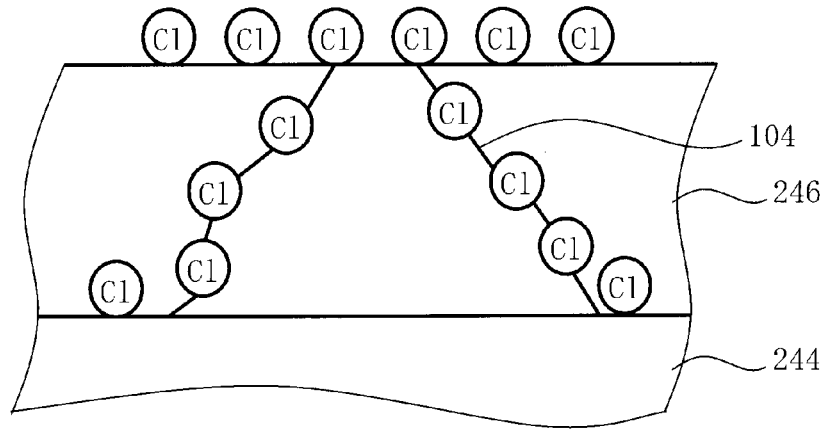
FIG. 12A and FIG. 12B are conceptual diagrams exemplifying conditions before and after the plasma treatment process in the embodiment 3.
Figure 12B:
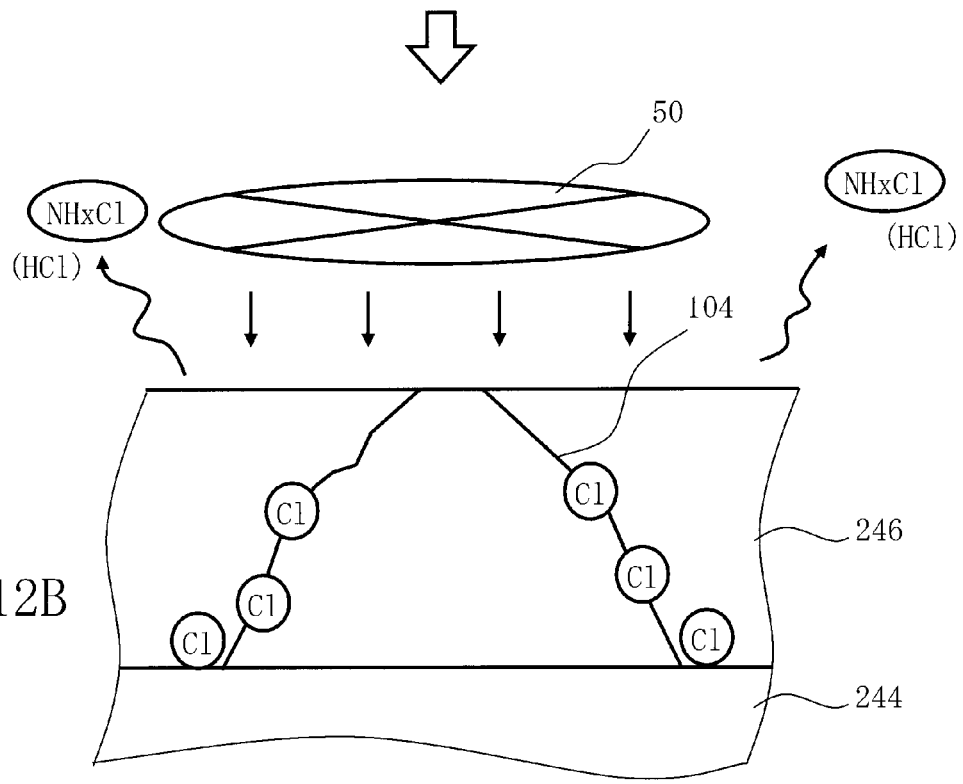

FIG. 12A and FIG. 12B are conceptual diagrams exemplifying conditions before and after a plasma treatment process in the embodiment 3. FIG. 12A shows a portion near the surface of the substrate 200 where the TiN film 246 is formed. When the TiN film 246 is formed by the CVD method, the chlorine (Cl) components of a $TiCl_4$ gas supplied for formation are bound to Ti and segregated on the surface, grain boundaries, and undersurface of the TiN film 246. If the quantity thereof is large, there is a possibility that Cu will react with Cl when the Cu seed film 250 is formed later, leading to deterioration. Thus, at least Cl on the surface of the TiN film 246 is removed by plasma treatment before the seed film 250 is formed.

As shown in FIG. 12B, after the TiN film 246 is formed, the TiN film 246 is exposed to an atmosphere of $NH_3$ plasma 50 while the TiN film 246 is exposed as the plasma treatment process (S111). Accordingly, at least Cl on the surface of the TiN film 246 is removed. $H_2$ plasma is also suitably used instead of the $NH_3$ plasma 50.

Figure 13:
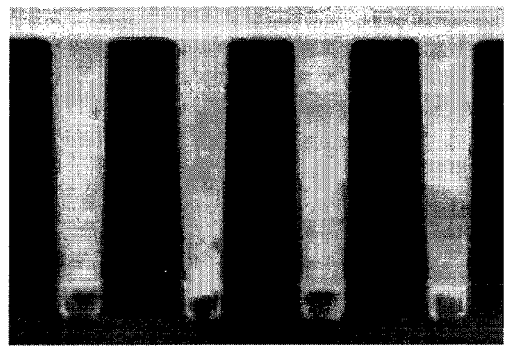
FIG. 13 is a conceptual diagram exemplifying Cu embedded conditions depending on presence or absence of the plasma treatment process in the embodiment 3.
Figure 13:
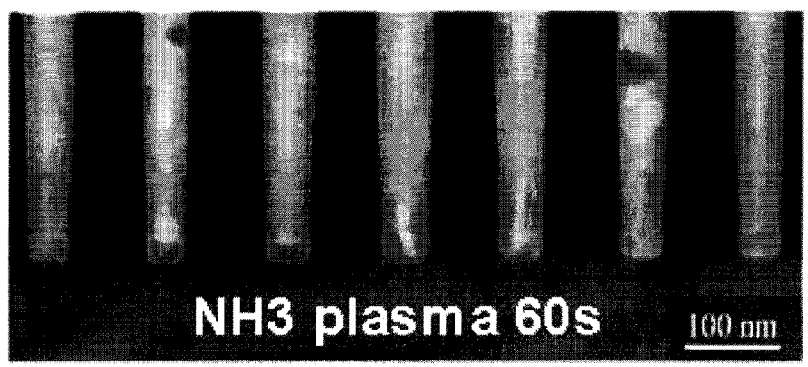
Figure 13:
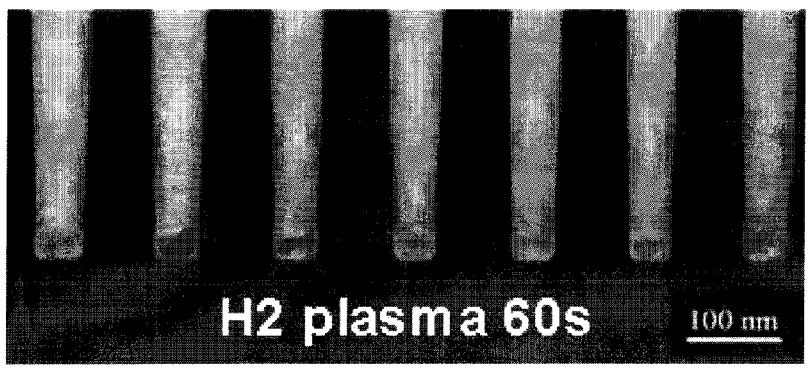

FIG. 13 is a conceptual diagram exemplifying Cu embedded conditions depending on the presence or the absence of the plasma treatment process in the embodiment 3. Poor embedding occurs for a contact plug 10 in a lower part thereof on which no plasma treatment is performed. In contrast, poor embedding is reduced for a contact plug 12 in the lower part thereof, on which plasma treatment with $NH_3$ plasma is performed. Similarly, poor embedding is also reduced for a contact plug 14 in the lower part thereof, on which plasma treatment with $H_2$ plasma is performed.

By removing Cl on the surface of the TiN film 246, as described above, deterioration of the Cu seed film 250 formed in a subsequent process can be prevented. As a result, the embeddability of Cu can be improved. Hereinafter, the content of each process from the seed film formation process (S115) to the polishing process (S118) is the same as that in the embodiment 1.

Embodiment 4

In the embodiment 2, impurities in a barrier metal film are removed by heat treatment after the Ru film 248 is formed. In the embodiment 4, a method of efficiently removing chlorine in particular (from among those impurities remaining in a barrier metal film) near the interface between the barrier metal film and the Ru film before the Ru film 248 is formed will be described.

Figure 14:
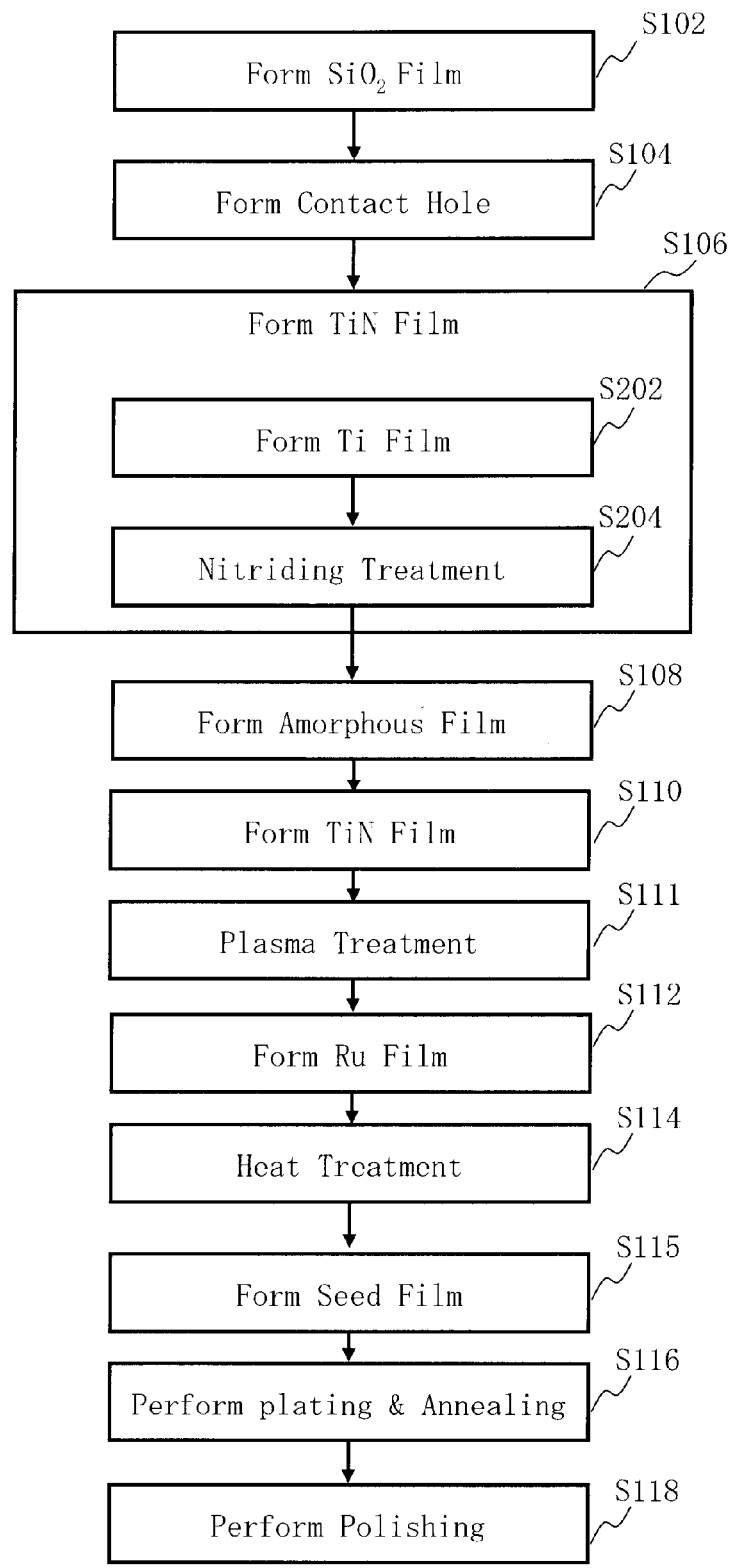
FIG. 14 is a flow chart showing principal parts of the method for fabricating a semiconductor device in an embodiment 4.

FIG. 14 is a flow chart showing the principal parts of the method for fabricating a semiconductor device in the embodiment 4. FIG. 14 is the same as FIG. 6, except that a plasma treatment process (S111) is added between the TiN film formation process (S110) and the ruthenium (Ru) film formation process (S112). Thus, the content of each process from the $SiO_2$ film formation process (S102) to the plasma treatment process (S111) is the same as that in the embodiment 3.

By removing Cl on the surface of the TiN film 246 as described above, deterioration of the Ru film 248 formed in subsequent processes can be prevented. As a result, wettability by the Ru film 248 to Cu can be maintained. Thus, Cu embeddability can be improved. Hereinafter, the content of each process from the ruthenium (Ru) film formation process (S112) to the polishing process (S118) is the same as that in the embodiment 2.

In the foregoing, the embodiments have been described with reference to concrete examples. However, the present invention is not limited to these concrete examples. In each embodiment described above, TiN is used as the material of the barrier metal film in the first and second layers, but the material is not limited to this. Other materials include tantalum nitride (TaN), tantalum (Ta), tantalum silicide nitride (TaSiN), and tungsten nitride (WN). Using these materials, the crystalline interface in the first layer and that in the second layer can similarly be shifted by reforming the surface of the first layer to form an amorphous layer, even if both have the same columnar crystal structure. As a result, barrier properties against Cu can be enhanced.

When TaN, Ta, TaSiN, or WN is used as the material of a barrier metal film, impurities contained in the barrier metal film can be removed at low temperatures by similarly performing heat treatment after Ru is formed.

In the above examples, cases in which a contact plug is formed on the substrate 200 is described, but a similar effect can be achieved when a contact plug is formed on a gate of the substrate 200.

Moreover, in addition to Ru, cobalt nitride (CoN) is suitably used as a material of a metal containing film in the third layer.

Electrolytic plating to form the Cu film 260 may be performed by using the Ru film 248 as a cathode electrode. Formation of the seed film 250 can thereby be omitted.

Though omitted in the above description, Cu—Sn alloys, Cu—Ti alloys, Cu—Al alloys and the like can be used as materials of contact plugs in each of the above embodiments in addition to Cu. On the other hand, a metal silicide layer may be formed on a substrate diffusion layer or gate electrode of the semiconductor substrate electrically connected to a contact plug before the contact hole is opened. Further, the thickness and number of layers of inter-level dielectric film and the size, shape, number, and the like of openings can be used by selecting what is needed for semiconductor integrated circuits and various semiconductor elements.

In addition, all semiconductor devices and methods for fabricating a semiconductor device that have elements of the present invention and whose design can be modified as necessary by persons skilled in the art are included in the scope of the present invention.

While techniques normally used in the semiconductor industry such as a photolithography process and cleaning before and after treatment are omitted for the sake of description, it goes without saying that such techniques are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device, comprising:
    a contact plug electrically connected to a semiconductor substrate;
    a first barrier metal film with a columnar crystal structure arranged in contact with the semiconductor substrate at least on a bottom surface side of the contact plug;
    an amorphous film made of a material of the first barrier metal film arranged in contact with the first barrier metal film at least on the bottom surface side of the contact plug;
    a second barrier metal film made of a material identical to that of the first barrier metal film and having a columnar crystal structure, at least a portion of which is arranged in contact with the amorphous film on the bottom surface side and a side surface side of the contact plug; and
    a dielectric film arranged on the side surface side of the contact plug.

2. The semiconductor device according to claim 1, further comprising a metal containing film arranged in contact with the second barrier metal film and the contact plug on the bottom surface side and the side surface side of the contact plug.

3. The semiconductor device according to claim 2, wherein ruthenium (Ru) is used as a material of the metal containing film.

4. The semiconductor device according to claim 1, wherein copper (Cu) is used as a material of the contact plug and titanium nitride (TiN) is used as a material of the first and second barrier metal films.

5. A semiconductor device, comprising:
    a contact plug electrically connected to a semiconductor substrate;
    a first barrier metal film with a columnar crystal structure arranged in contact with the semiconductor substrate at least on a bottom surface side of the contact plug;
    a second barrier metal film made of a material identical to that of the first barrier metal film and with a columnar crystal structure that is arranged on the bottom surface side and a side surface side of the contact plug and whose crystalline interface is shifted from that of the first barrier metal film;
    a metal containing film arranged in contact with the second barrier metal film and the contact plug on the bottom surface side and the side surface side of the contact plug; and
    a dielectric film arranged on the side surface side of the contact plug.

6. The semiconductor device according to claim 5, wherein ruthenium (Ru) is used as a material of the metal containing film.

7. The semiconductor device according to claim 5, wherein copper (Cu) is used as a material of the contact plug and titanium nitride (TiN) is used as a material of the first and second barrier metal films.

8. The semiconductor device according to claim 5, further comprising an amorphous film made of a material of the first barrier metal film between the first and second barrier metal films.

9. A method for fabricating a semiconductor device, comprising:
    forming a dielectric film above a semiconductor substrate;
    forming an opening cutting through to the semiconductor substrate in the dielectric film;
    forming a first barrier metal film with a columnar crystal structure in the opening;
    forming an amorphous film made of a material of the first barrier metal film by reforming a surface of the first barrier metal film;
    forming a second barrier metal film made of a material identical to that of the first barrier metal film and with a columnar crystal structure above the amorphous film in the opening; and
    depositing a contact plug material inside the opening after the second barrier metal film being formed.

10. The method according to claim 9, further comprising: forming a metal containing film above the second barrier metal film in the opening after the second barrier metal film has been formed and before the contact plug material has been deposited.

11. The method according to claim 10, wherein ruthenium (Ru) is used as a material of the metal containing film.

12. The method according to claim 11, further comprising: performing heat treatment after the metal containing film has been formed and before the contact plug material has been deposited.

13. The method according to claim 12, wherein a temperature of the heat treatment is 200° C. or below.

14. The method according to claim 13, wherein the second barrier metal film is formed by a chemical vapor deposition (CVD) method.

15. The method according to claim 12, further comprising: performing plasma treatment of the second barrier metal film after the second barrier metal film has been formed and before the metal containing film has been formed.

16. The method according to claim 9, further comprising: performing plasma treatment of the second barrier metal film after the second barrier metal film has been formed and before the contact plug material has been deposited.

17. The method according to claim 16, wherein the second barrier metal film is exposed to a plasma atmosphere using either ammonia ($NH_3$) or hydrogen ($H_2$) when performing the plasma treatment.

18. The method according to claim 17, wherein the second barrier metal film is formed by a chemical vapor deposition (CVD) method.

19. The method according to claim 9, wherein the surface of the first barrier metal film is reformed by the first barrier metal film being exposed to a plasma atmosphere.

20. The method according to claim 9, wherein the first barrier metal film is a titanium nitride (TiN) film obtained by nitriding titanium (Ti) formed by a plasma CVD method and the second barrier metal film is a titanium nitride (TiN) film formed by a thermal CVD method.

* * * * *